US006295195B1

(12) United States Patent
Maejima

(10) Patent No.: US 6,295,195 B1
(45) Date of Patent: Sep. 25, 2001

(54) CAPACITOR HAVING FIRST AND SECOND PROTECTIVE FILMS

(75) Inventor: Yukihiko Maejima, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/472,991

(22) Filed: Dec. 28, 1999

(30) Foreign Application Priority Data

Dec. 28, 1998 (JP) .................................. 10-371770

(51) Int. Cl.$^7$ ....................................................... H01G 4/00

(52) U.S. Cl. ........................................ 361/301.3; 361/303

(58) Field of Search ................................ 361/301.3, 303, 361/306.1, 306.3, 311–313

(56) References Cited

U.S. PATENT DOCUMENTS 5,206,788 * 4/1993 Larson .................................. 361/313

* cited by examiner

Primary Examiner—Anthony Dinkins
(74) Attorney, Agent, or Firm—Young & Thompson

(57) ABSTRACT

The present invention provides a method of patterning top and bottom electrodes of a capacitor. The method comprises the steps of: selectively forming a first mask made of a first material which has a barrier property to hydrogen on a top electrode of the capacitor; selectively etching a top electrode layer and a capacitive dielectric film by use of the first mask; without removing the first mask from the top electrode, selectively forming a second mask made of a second material which has a barrier property to hydrogen so that the second mask covers the first mask, the top electrode and the capacitive dielectric film and also covers a bottom electrode layer; and selectively etching a bottom electrode layer.

4 Claims, 35 Drawing Sheets

CAPACITOR HAVING FIRST AND SECOND PROTECTIVE FILMS

BACKGROUND OF THE INVENTION

The present invention relates to a capacitor and a method of forming the same, and more particularly to a capacitor in a semiconductor memory device and a method of forming the same.

A ferroelectric memory has a capacitor utilizing a semiconductor in combination with a ferroelectric, for example, $Pb(Zr_{1-x}, Ti_x)O_3$ hereinafter referred to as a "PZT", wherein a remanence of the ferroelectric is utilized to store "1" and "0". FIG. 1 is a diagram illustrative of a variation in polarization of the ferroelectric versus an applied bias to the ferroelectric of the ferroelectric capacitor. Once a positive bias is applied to the ferroelectric, then the bias becomes zero, whereby the polarization does not become zero and a positive remanence Pr remains. Once a negative bias is applied to the ferroelectric, then the bias becomes zero, whereby the polarization does not become zero and a negative remanence –Pr remains. The positive and negative remanences are detected to judge "1" and "0" as binary digit data. After a power is discontinued, the informations of "1" and "0" remain, for which reason a non-volatile memory can be realized. In this memory, the ferroelectric capacitor and a silicon LSI are formed on the same substrate, wherein both the ferroelectric capacitor and the silicon LSI are required to show sufficiently high performances. In the manufacturing processes, the capacitor is covered by a barrier layer such as a silicon nitride barrier layer to prevent a reduction of the ferroelectric in a hydrogen atmosphere for the silicon LIS process after the ferroelectric capacitor is shaped by a dry etching. Particularly, a hydrogen anneal process is important for reducing the interface state density of the MOS transistors after aluminum interconnections have been formed.

In Japanese patent applications Nos. 7-111318 and 9-049526, the ferroelectric capacitors and methods of forming the same are disclosed. FIGS. 2A through 2M are fragmentary cross sectional elevation views illustrative of a conventional method of forming ferroelectric capacitors in a semiconductor memory device.

With reference to FIG. 2A, a bottom electrode layer 2 comprising laminations of a Pt layer and a Ti layer is laminated on a BPSG base oxide layer 1. A PZT ferroelectric layer 3 is laminated on the bottom electrode layer 2. A Pt top electrode layer 4 is laminated on the PZT ferroelectric layer 3.

With reference to FIG. 2B, a first photo-resist pattern 6 is selectively formed on the Pt top electrode layer 4.

With reference to FIG. 2C, a first dry etching is carried out by use of the first photo-resist pattern 6 to selectively etch the laminations of the PZT ferroelectric layer 3 and the Pt top electrode layer 4. As a reaction gas, a mixture gas of a $Cl_2$ and Ar is used to selectively etch the Pt top electrode layer 4. As a reaction gas, a mixture gas of a $CF_4$ and Ar is used to selectively etch the PZT ferroelectric layer 3, whereby the top electrode is formed.

With reference to FIG. 2D, the used first photo-resist pattern 6 is removed.

With reference to FIG. 2E, a second photo-resist pattern 8 is formed which covers the top electrode comprising the PZT ferroelectric layer 3 and the Pt top electrode layer 4 and also covers a peripheral region of the top electrode.

With reference to FIG. 2F, a second dry etching is carried out by use of the second photo-resist pattern 8 to selectively etch the bottom electrode layer 2. As a reaction gas, a mixture gas of a $Cl_2$ and Ar is used to selectively etch the bottom electrode layer 2. The bottom electrode is formed.

With reference to FIG. 2G, the second photo-resist pattern 8 is removed, whereby the ferroelectric capacitor is shaped on the base layer 1.

With reference to FIG. 2H, a silicon nitride hydrogen barrier layer 12 is entirely deposited to cover the ferroelectric capacitor.

With reference to FIG. 2I, a third photo-resist pattern 9 is formed on the silicon nitride hydrogen barrier layer 12.

With reference to FIG. 2J, a third dry etching is carried out by use of the third photo-resist pattern 9 to form an opening in the silicon nitride hydrogen barrier layer 12, so that the opening is positioned over the top electrode 4 of the ferroelectric capacitor.

With reference to FIG. 2K, the third photo-resist pattern 9 is removed.

With reference to FIG. 2L, a heat treatment is carried out in an oxygen atmosphere to recover the damage of the PZT ferroelectric layer 3, wherein the PZT ferroelectric layer 3 has received the damage in the process of forming the silicon nitride hydrogen barrier layer 12.

With reference to FIG. 2M, a capacitor cover layer 10 is entirely formed which covers the top of the top electrode 4 of the ferroelectric capacitor and the silicon nitride hydrogen barrier layer 12.

In the above processes, after the top electrode and the bottom electrode are formed by the dry etchings using the photo-resist patterns as masks, the hydrogen barrier layer is entirely formed.

After the capacitor cover layer 10 has been formed, aluminum interconnection layers are formed and a hydrogen anneal is carried out.

The above conventional processes have the following problems. The photo-resist films are used as the masks for dry etching processes to form the top and bottom electrodes. The use of the photo-resist is advantageous in convenience but the following problems are raised.

The first problem is in shapes of the PZT ferroelectric layer 3 and the Pt top electrode 4. FIG. 3A is an enlarged fragmentary cross sectional elevation view illustrative of the edge of the ferroelectric capacitor in a dry etching process of FIG. 2C. FIG. 3B is an enlarged fragmentary cross sectional elevation view illustrative of the edge of the ferroelectric capacitor after aching process for removal of a used photo-resist pattern of FIG. 2D. As shown in FIG. 3A, a side wall deposit 13 is deposited on side walls of the laminations of the PZT ferroelectric layer 3, the Pt top electrode 4 and the first photo-resist pattern 6. Reaction products of Pt and PZT are non-volatile and are deposited on the side walls hereby forming the side wall deposit 13. A selective etching rate of Pt or PZT to the photo-resist is 1:2. The necessary thickness of the photo-resist is about 2 micrometers, so that the photo-resist film has a thickness of not less than about 1 micrometer after the dry etching has been carried out in order to obtain a sufficiently high accuracy in patterning the top electrode. The height of the side wall deposit 13 is almost the same as the height of the photo-resist film. After the first photo-resist film 6 has been removed, the side wall deposit 13 remains as shown in FIG. 3B. If the side wall deposit 13 is made into contact with the top electrode 4, a short circuit is formed between the top and bottom electrodes. The formation of the side wall deposit 13 reduces the yield of the semiconductor device having the capacitor.

In order to suppress the formation of the side wall deposit 13, it is most effective to retreat the photo-resist film during the dry etching process. FIG. 4A is an enlarged fragmentary cross sectional elevation view illustrative of the edge of the ferroelectric capacitor in a dry etching process of FIG. 2C. FIG. 4B is an enlarged fragmentary cross sectional elevation view illustrative of the edge of the ferroelectric capacitor after aching process for removal of a used photo-resist pattern of FIG. 2D. In order to retreat the photo-resist film during the dry etching process, a reactive gas including a large amount of a gas such as $Cl_2$ having a low selective ratio to the photo-resist is used so that the photo-resist is etched in a lateral direction. The cross sectional shape of the photo-resist becomes tapered shape so that the side walls are gently sloped whereby the side wall deposit is unlikely to be formed in the dry etching process. Once the side wall deposit is formed on the gently sloped side walls, then the side wall deposit is likely to be etched by the dry etching process. The Pt top electrode layer 4 may be etched to form gently sloped side walls and the cross sectional shape of the Pt top electrode layer 4 becomes tapered. Generally, the thickness of the Pt top electrode layer is about 200 nanometers. The thickness of the Pt layer of the bottom electrode layer is also about 200 nanometers. The thickness of the Ti layer of the bottom electrode layer is about 20 nanometers. The thickness of the PZT ferroelectric layer is about 300 nanometers. If the tapered angle or the grade of the gentle slop of the side wall becomes not more than 45 degrees, the horizontal size of the top electrode is different from the designed value. For example, if the top size of the top electrode is 1 micrometer, then the bottom size of the bottom electrode is 2 micrometers. This makes it difficult to scale down the horizontal size of the capacitor and also to improve the density of integration of the semiconductor device.

The use of the photo-resist mask for the drying etching processes for etching the Pt top electrode layer and the PZT ferroelectric layer makes it difficult to obtain a highly accurate horizontal size of the top electrode of the ferroelectric capacitor In the above circumstances, it had been required to develop a novel capacitor and a novel method of forming the capacitor free from the above problem.

SUMMARY OF THE INVENTION

Accordingly, it is an object of the present invention to provide a novel capacitor free from the above problems.

It is a further object of the present invention to provide a novel capacitor having a highly accurate horizontal size.

It is a still further object of the present invention to provide a novel method of forming a capacitor free from the above problems.

It is yet a further object of the present invention to provide a novel method of forming a capacitor having a highly accurate horizontal size.

It is yet a further object of the present invention to provide a novel method of forming a capacitor at a high yield.

The present invention provides a capacitor in a semiconductor device. The capacitor comprises top and bottom electrodes and a capacitive dielectric layer sandwiched between the top and bottom electrodes, wherein at least a top surface of the top electrode is covered by at least a protective film which has a lower etching rate than the top and bottom electrodes and also has a barrier property to hydrogen.

The present invention also provides a method of patterning top and bottom electrodes of a capacitor. The method comprises the steps of: selectively forming a first mask made of a first material which has a barrier property to hydrogen on a top electrode of the capacitor; selectively etching a top electrode layer and a capacitive dielectric film by use of the first mask; without removing the first mask from the top electrode, selectively forming a second mask made of a second material which has a barrier property to hydrogen so that the second mask covers the first mask, the top electrode and the capacitive dielectric film and also covers a bottom electrode layer; and selectively etching a bottom electrode layer.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
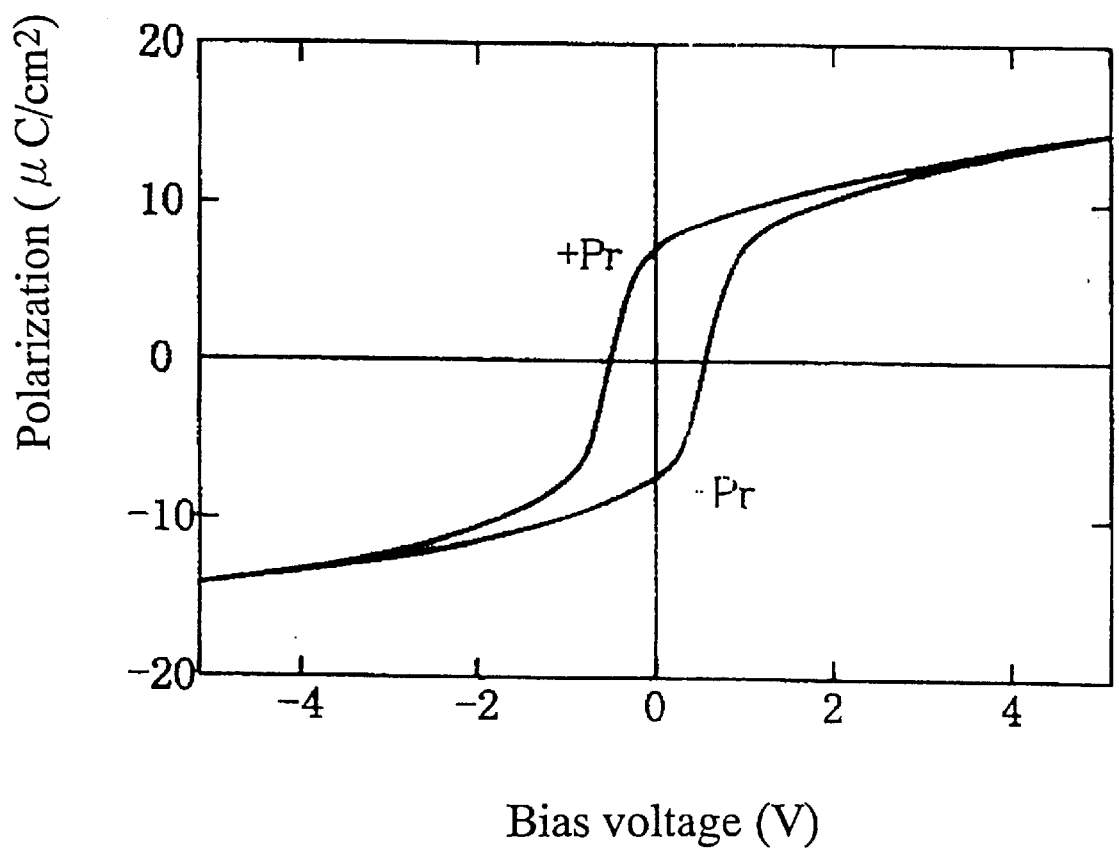
FIG. 1 is a diagram illustrative of a variation in polarization of the ferroelectric versus an applied bias to the ferroelectric of the ferroelectric capacitor.
Figure 2A:
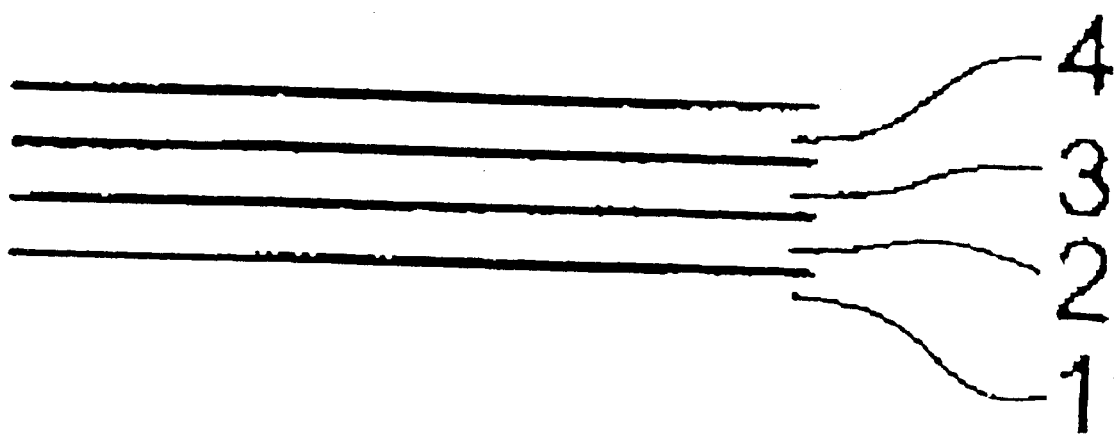
FIGS. 2A through 2M are fragmentary cross sectional elevation views illustrative of a conventional method of forming ferroelectric capacitors in a semiconductor memory device.
Figure 2B:
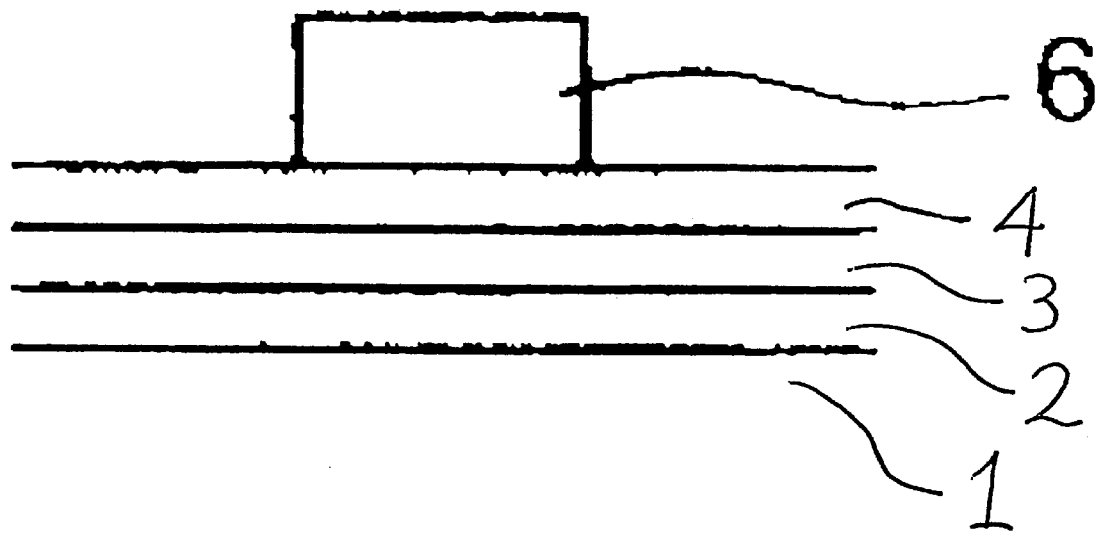
Figure 2C:
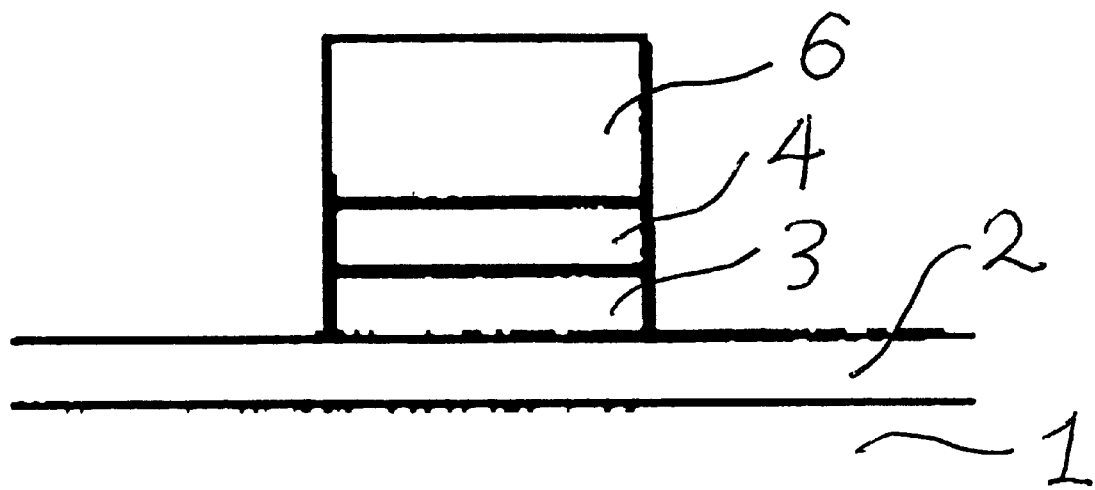
Figure 2D:
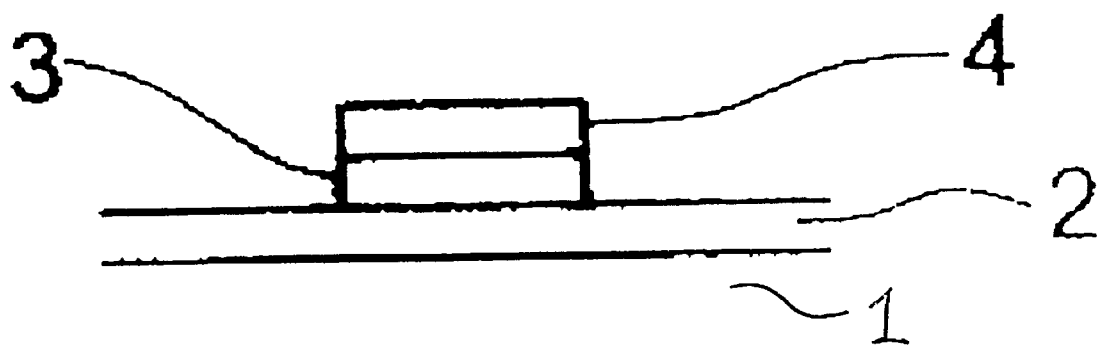
Figure 2E:
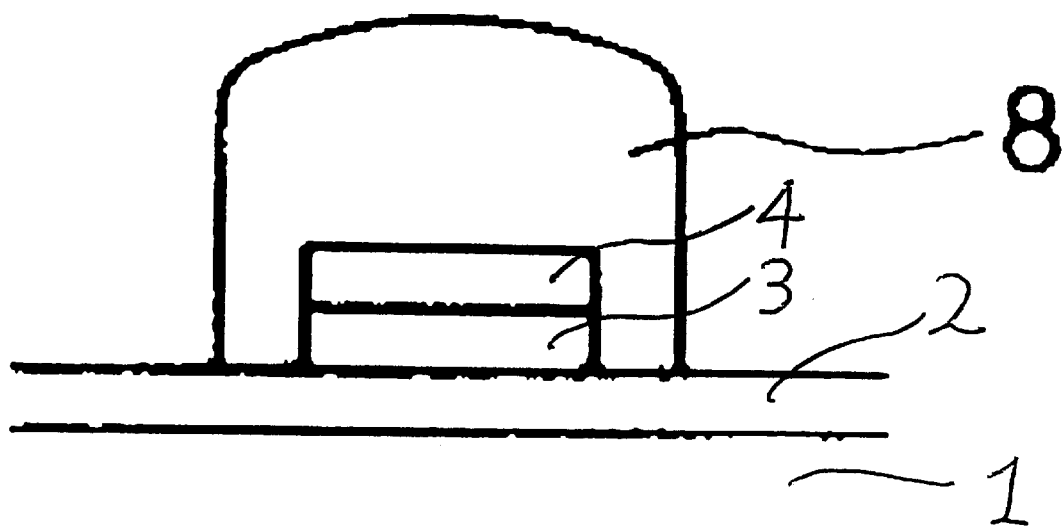
Figure 2F:
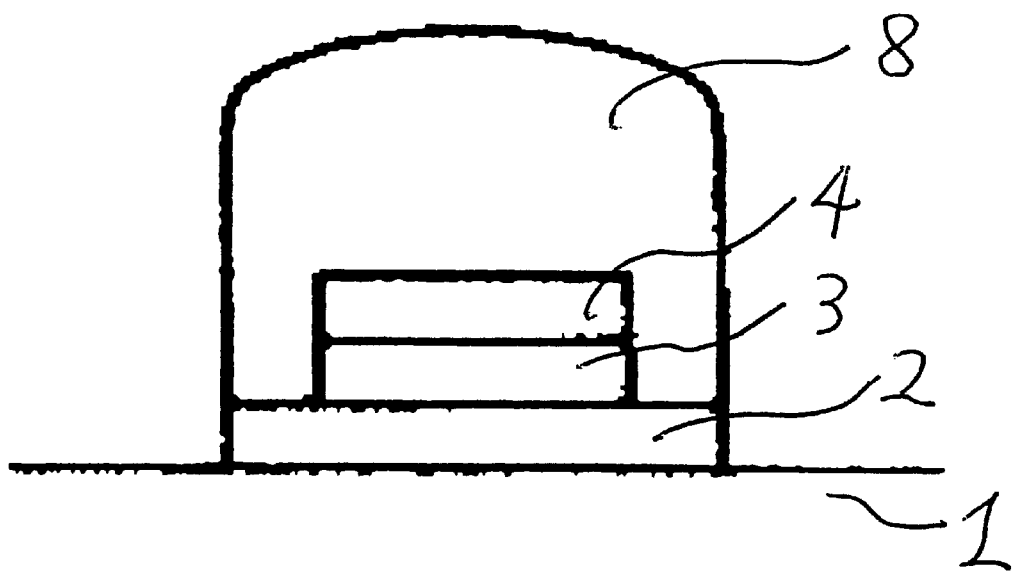
Figure 2G:
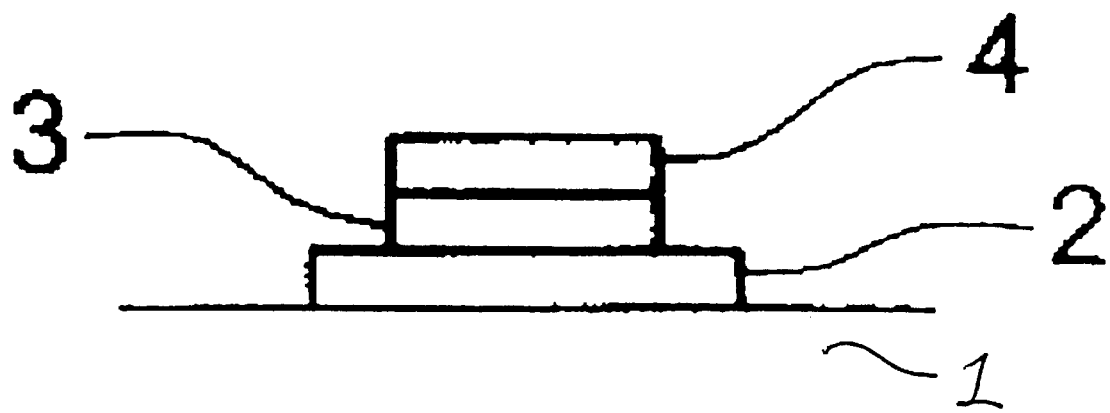
Figure 2H:
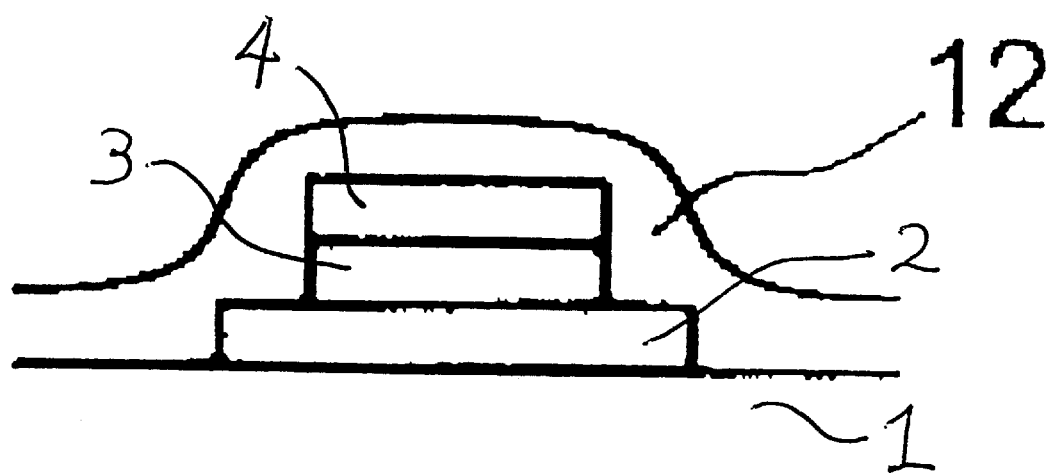
Figure 2I:
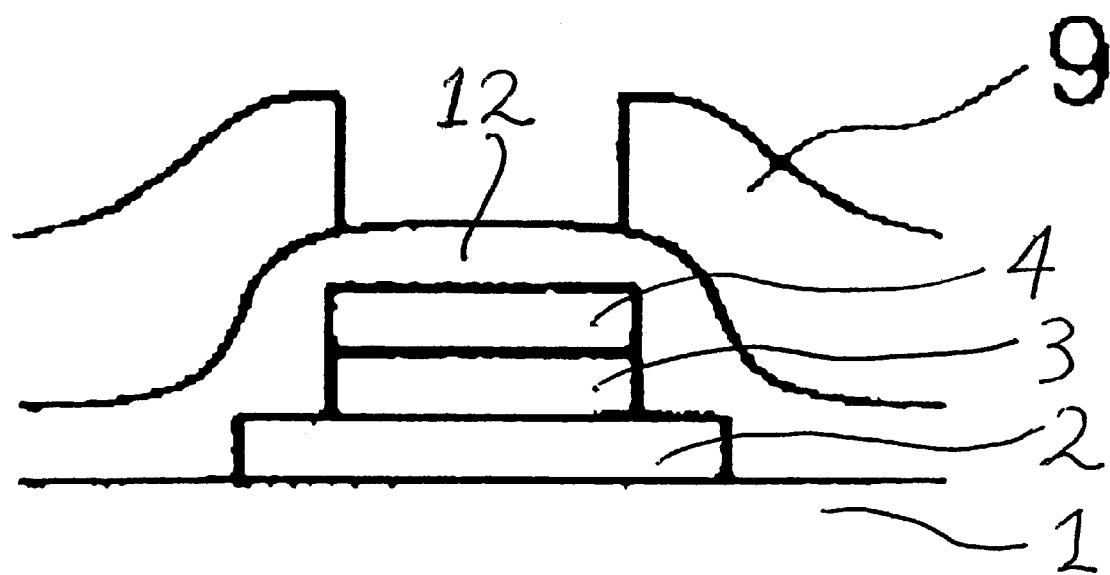
Figure 2J:
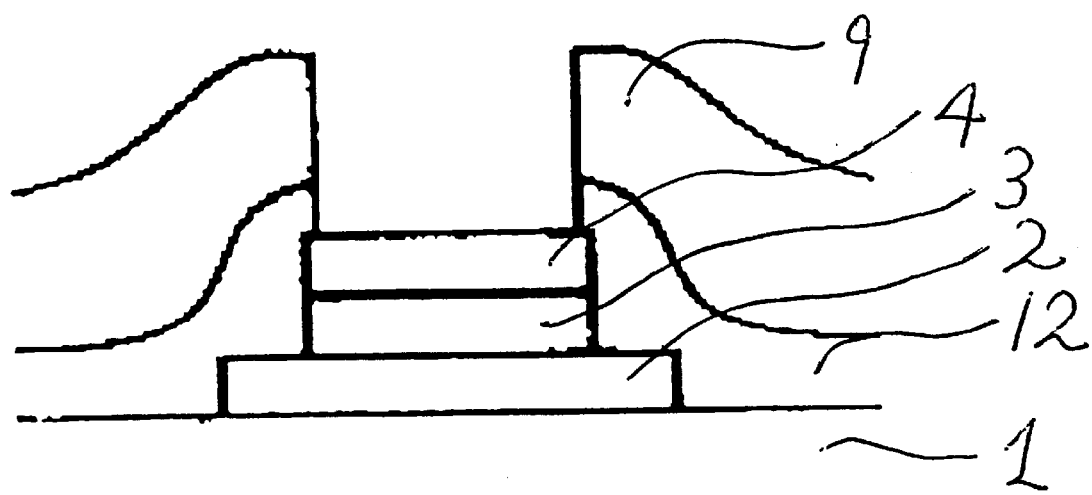
Figure 2K:
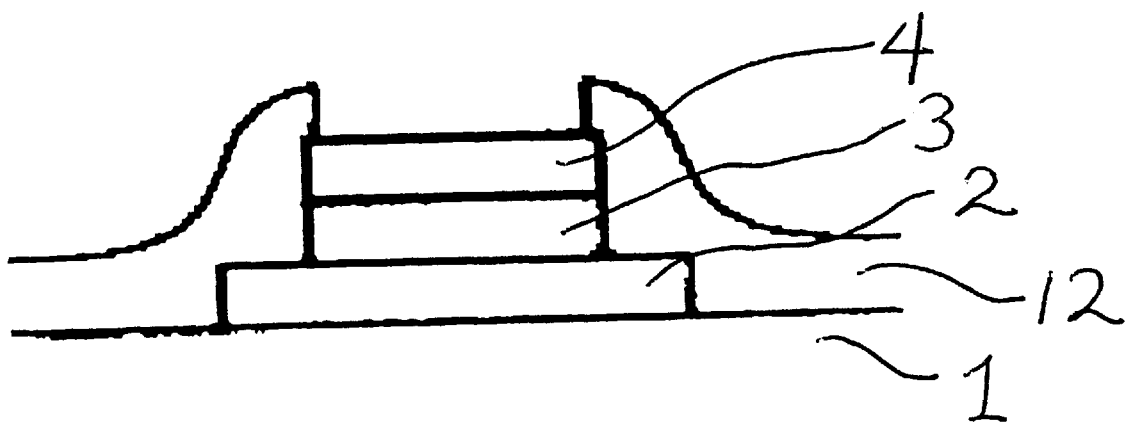
Figure 2L:
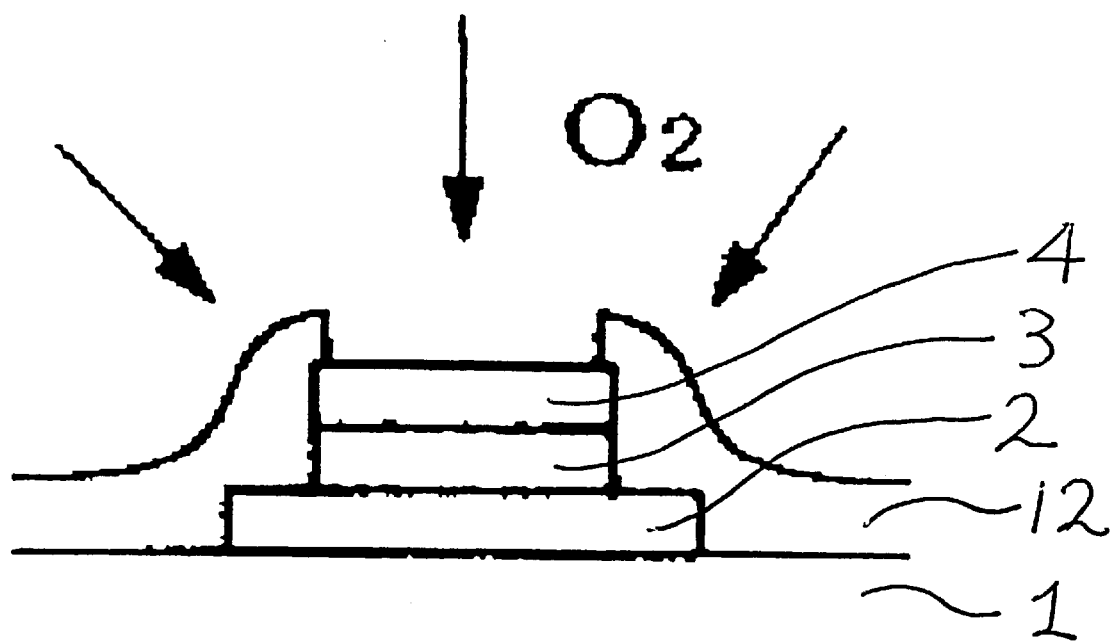
Figure 2M:
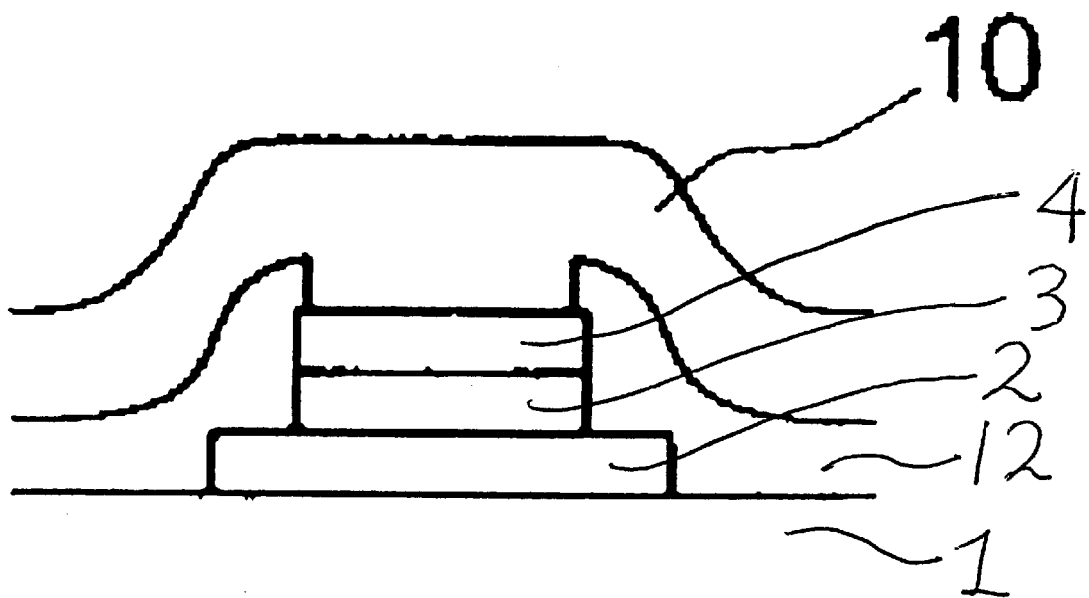
Figure 3A:
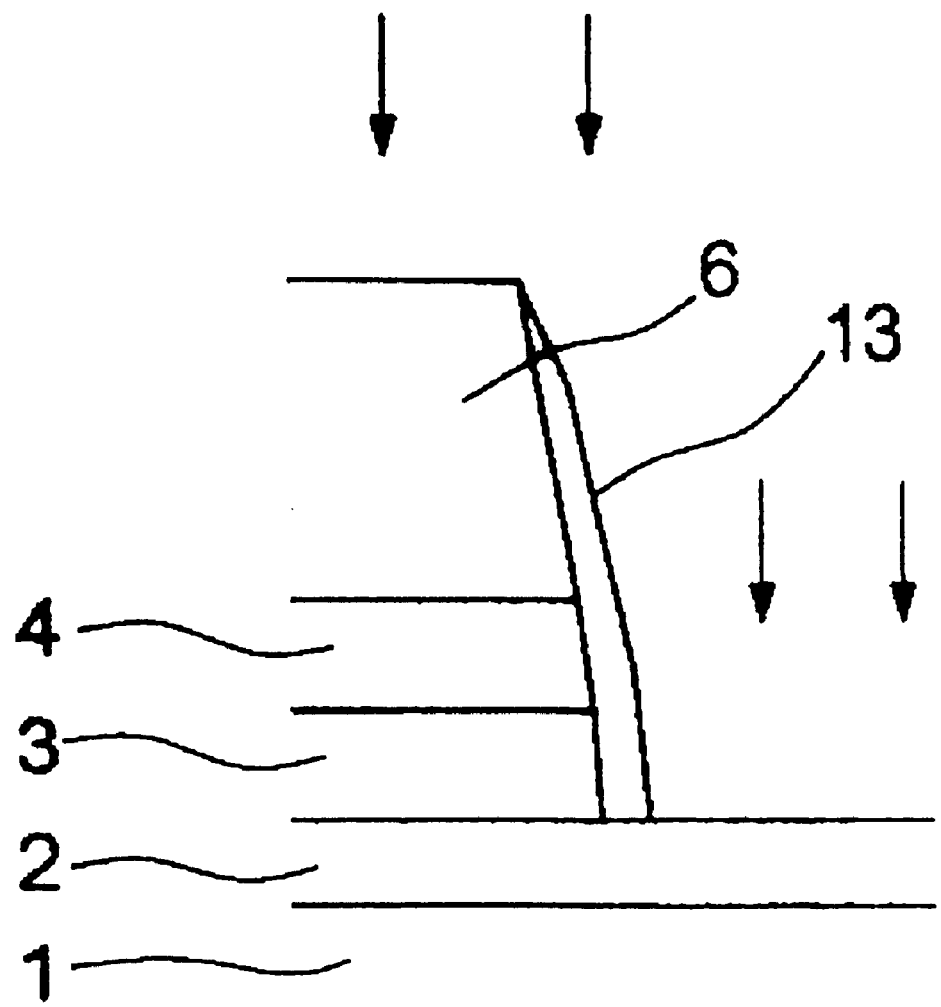
FIG. 3A is an enlarged fragmentary cross sectional elevation view illustrative of the edge of the ferroelectric capacitor in a dry etching process of FIG. 2C.
Figure 3B:
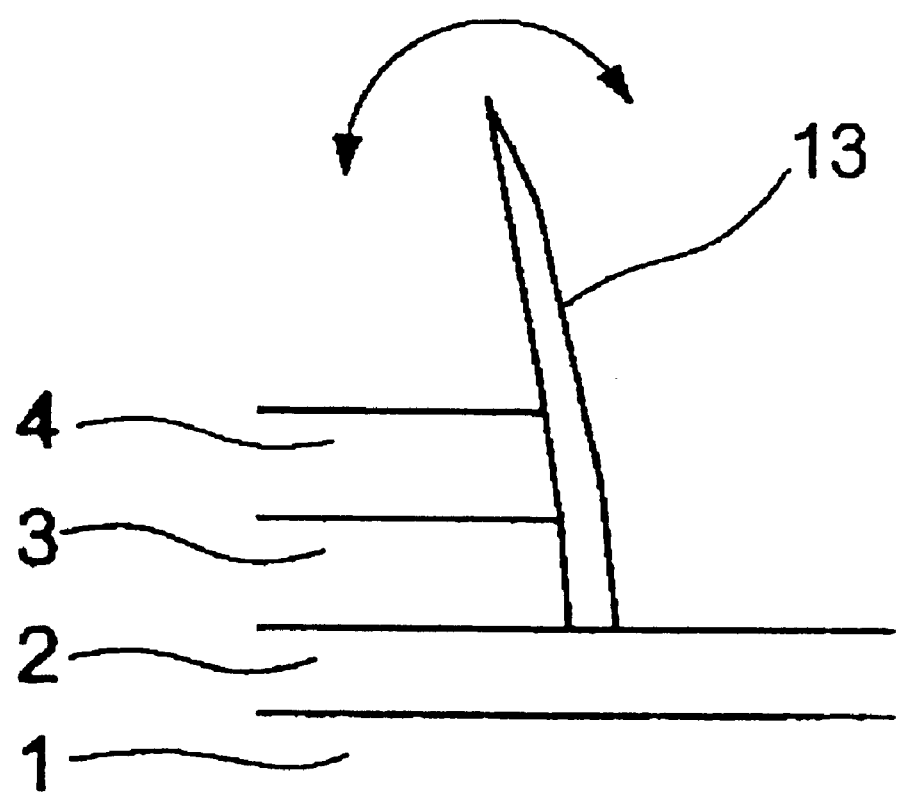
FIG. 3B is an enlarged fragmentary cross sectional elevation view illustrative of the edge of the ferroelectric capacitor after aching process for removal of a used photo-resist pattern of FIG. 2D.
Figure 4A:
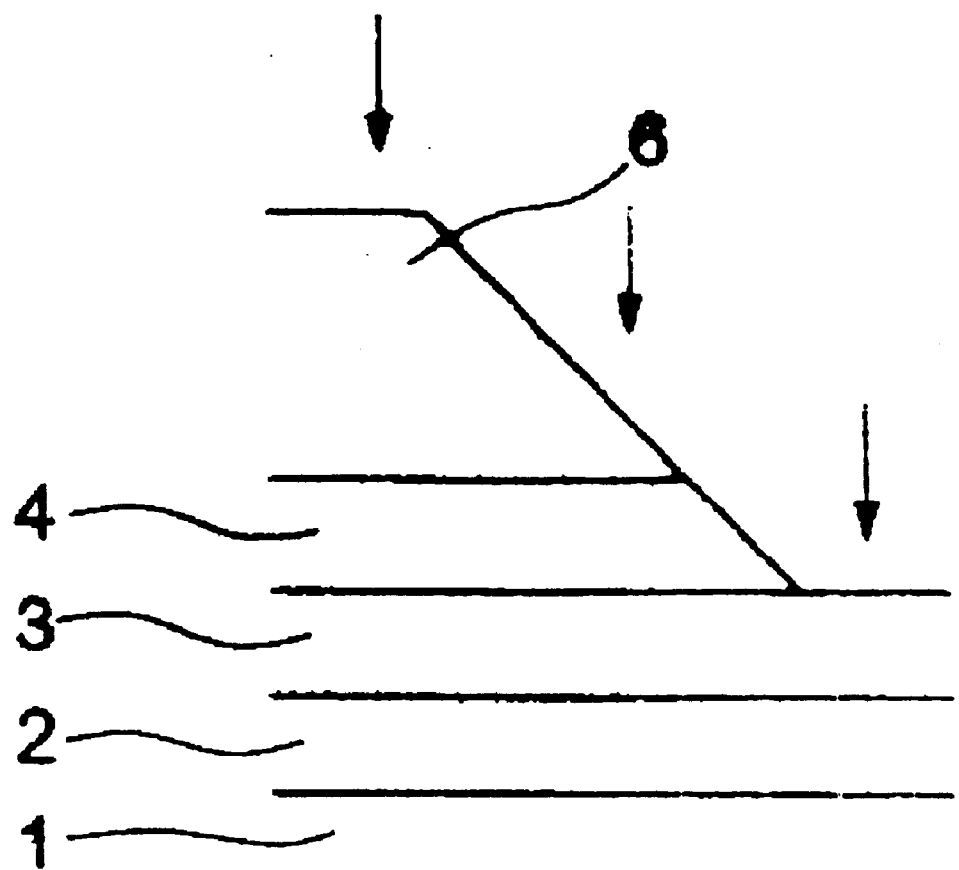
FIG. 4A is an enlarged fragmentary cross sectional elevation view illustrative of the edge of the ferroelectric capacitor in a dry etching process of FIG. 2C.
Figure 4B:
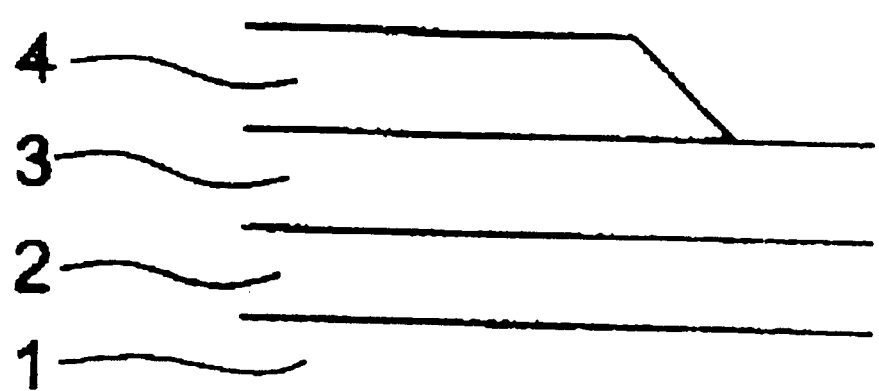
FIG. 4B is an enlarged fragmentary cross sectional elevation view illustrative of the edge of the ferroelectric capacitor after aching process for removal of a used photo-resist pattern of FIG. 2D.

The present invention provides a capacitor in a semiconductor device. The capacitor comprises top and bottom electrodes and a capacitive dielectric layer sandwiched between the top and bottom electrodes, wherein at least a top surface of the top electrode is covered by at least a protective film which has a lower etching rate than the top and bottom electrodes and also has a barrier property to hydrogen.

It is preferable that the at least a protective film comprises a first protective film which is provided on at least a part of a top surface of the top electrode, and a second protective film which covers the capacitor and the first film.

It is further preferable that each of the first and second protective films is made of one selected from the group consisting of silicon nitride, titanium nitride, aluminum nitride and tungsten nitride.

It is also preferable that a contact hole is provided which penetrates the first and second protective films.

It is also preferable that the capacitive dielectric layer is made of a ferroelectric material.

The present invention also provides a method of patterning a top electrode of a capacitor by an etching process which uses a mask made of a material which has a barrier property to hydrogen.

It is preferable that the material of the mask is one selected from the group consisting of silicon nitride, titanium nitride, aluminum nitride and tungsten nitride.

It is also preferable that the top electrode is laminated on a ferroelectric layer as a capacitive dielectric layer of the capacitor.

The present invention also provides a method of patterning a bottom electrode of a capacitor by an etching process which uses a mask made of a material which has a barrier property to hydrogen.

It is preferable that the material of the mask is one selected from group consisting of silicon nitride, titanium nitride, aluminum nitride and tungsten nitride.

It is also preferable that the bottom electrode underlie a ferroelectric layer as a capacitive dielectric layer of the capacitor.

The present invention also provides a method of patterning top and bottom electrodes of a capacitor. The method comprises the steps of: electively forming a first mask made of a first material which has a barrier property to hydrogen on a top electrode of the capacitor; selectively etching a top electrode layer and a capacitive dielectric film by use of the first mask; without removing the first mask from the top electrode, selectively forming a second mask made of a second material which has a barrier property to hydrogen so that the second mask covers the first mask, the top electrode and the capacitive dielectric film and also covers a bottom electrode layer; and selectively etching a bottom electrode layer.

It is preferable that the firs mask is formed by a plasma enhanced chemical vapor deposition o silicon nitride and subsequent patterning a silicon nitride film.

It is also preferable that the first mask is formed by a sputtering deposition of one selected from the group consisting of titanium nitride, aluminum nitride and tungsten nitride and subsequent patterning a deposition film.

It is also preferable that the second mask is formed by a plasma enhanced chemical vapor deposition of silicon nitride and subsequent patterning a silicon nitride film.

It is also preferable that the second mask is formed by a sputtering deposition of one selected from the group consisting of titanium nitride, aluminum nitride and tungsten nitride and subsequent patterning a deposition film.

In accordance with the present invention, the capacitor is formed as follows FIGS. 5A through 5M are fragmentary cross sectional elevation views illustrative of a novel method of forming ferroelectric capacitors in a semiconductor memory device in a first embodiment in accordance with the present invention. In this novel method, the top and bottom electrodes are patterned by use of the silicon nitride masks without using the photo-resist masks. The silicon nitride masts remain after the dry etching processes.

Figure 5A:
FIGS. 5A through 5P are fragmentary cross sectional elevation views illustrative of a novel method of forming ferroelectric capacitors in a semiconductor memory device in a first embodiment in accordance with the present invention.

With reference to FIG. 5A, a bottom electrode layer 2 comprising laminations of a Pt layer and a Ti layer is laminated on a BPSG base oxide layer 1. A PZT ferroelectric layer 3 is laminated on the bottom electrode layer 2. A Pt top electrode layer 4 is laminated on the PZT ferroelectric layer 3.

Figure 5B:
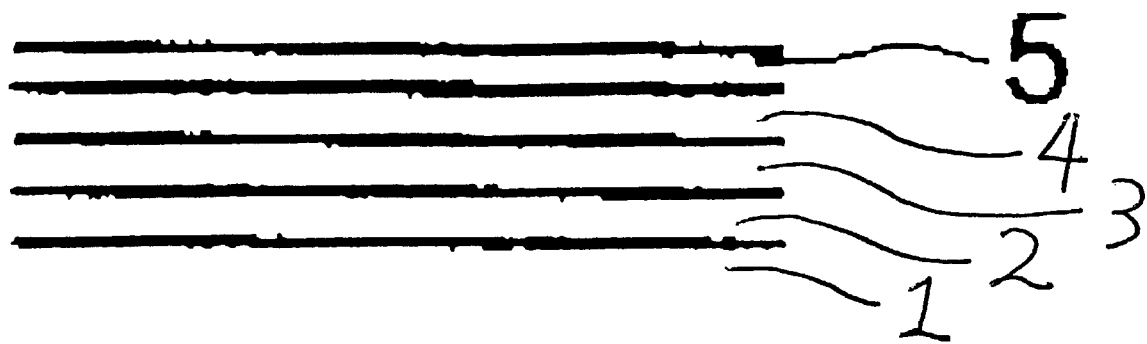

With reference to FIG. 5B, a first silicon nitride layer 5 is laminated on the Pt top electrode layer 4.

Figure 5C:
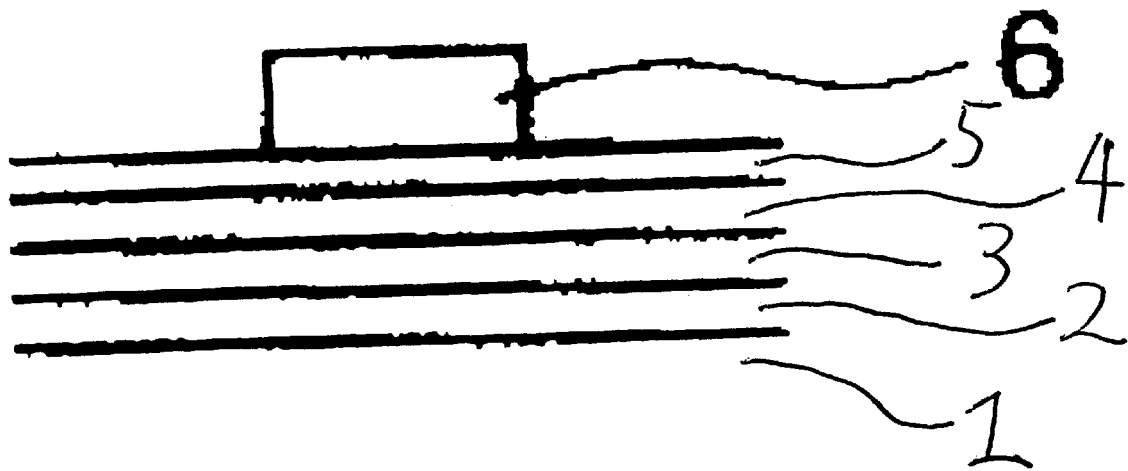

With reference to FIG. 5C, a first photo-resist pattern 6 is selectively formed on the first silicon nitride layer 5.

Figure 5D:
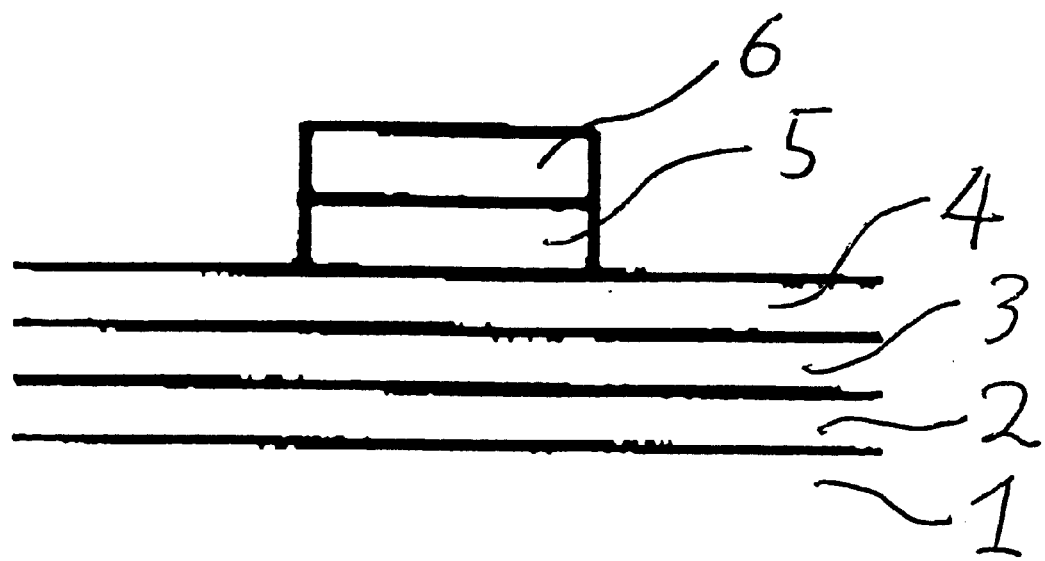

With reference to FIG. 5D, a first dry etching is carried out by use of the first photo-resist pattern 6 to selectively etch the first silicon nitride layer 5, wherein a $CHF_3$ gas is used.

Figure 5E:
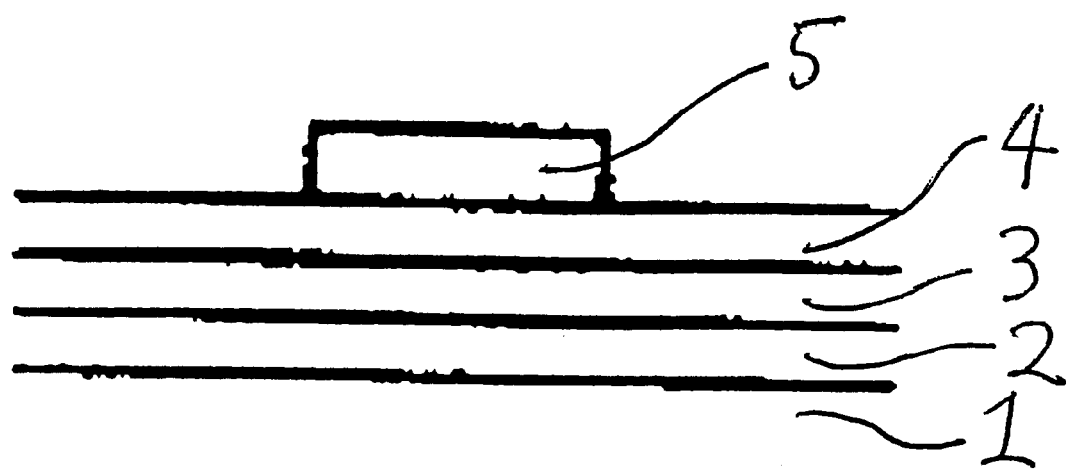

With reference to FIG. 5E, the first photo-resist pattern 6 is removed.

Figure 5F:
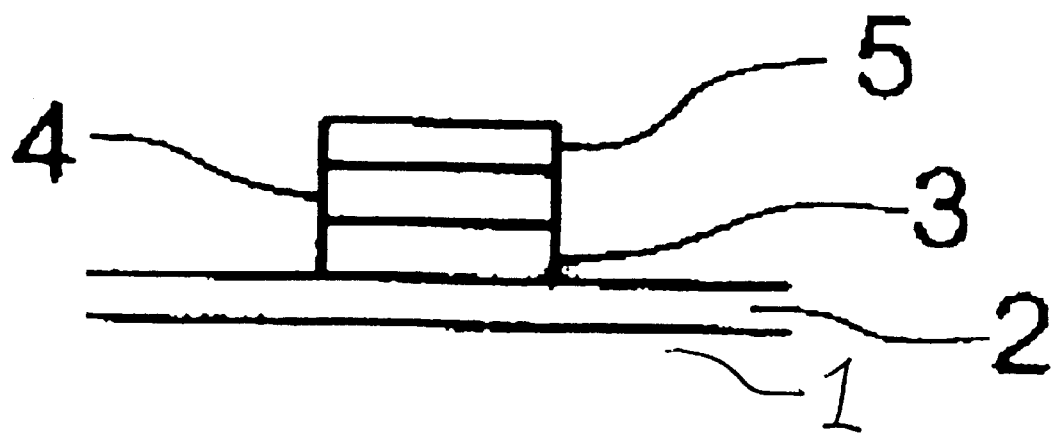

With reference to FIG. 5F, a second dry etching is carried out by use of the remaining first silicon nitride layer 5 as a mask to selectively etch laminations of the PZT ferroelectric layer 3 and the Pt top electrode layer 4.

Figure 5G:
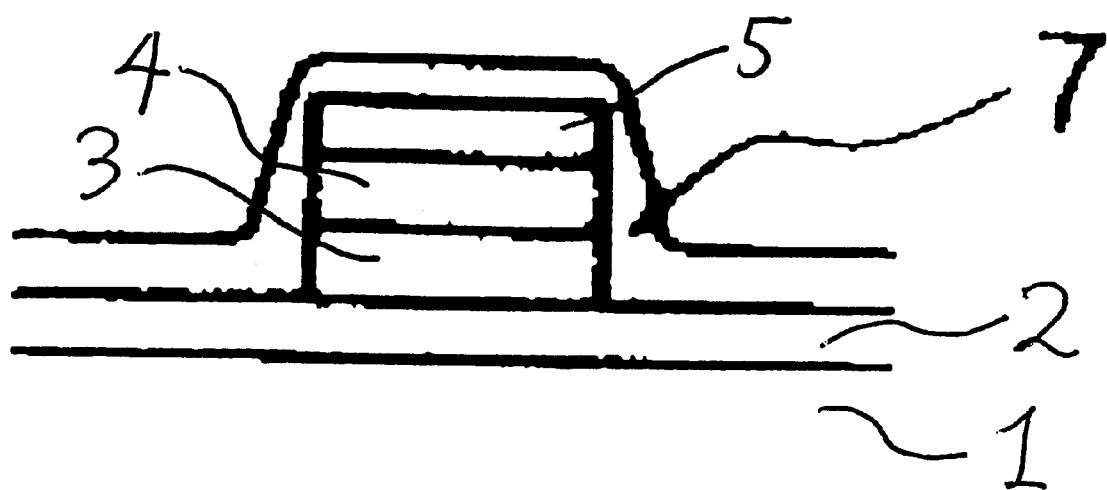

With reference to FIG. 5G, a second silicon nitride film 7 is entirely formed which covers the remaining first silicon nitride layer 5 and the bottom electrode layer 2.

With reference to FIG, 5H, a second photo-resist pattern 8 is formed which covers the second silicon nitride film 7 covering the laminated structure.

Figure 5H:
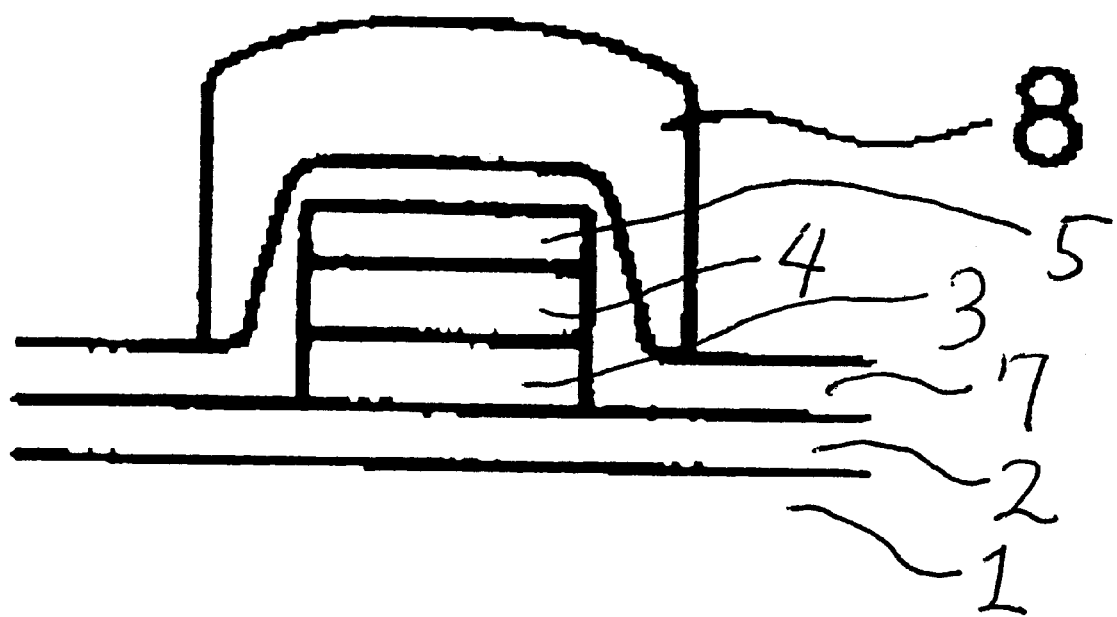
Figure 5I:
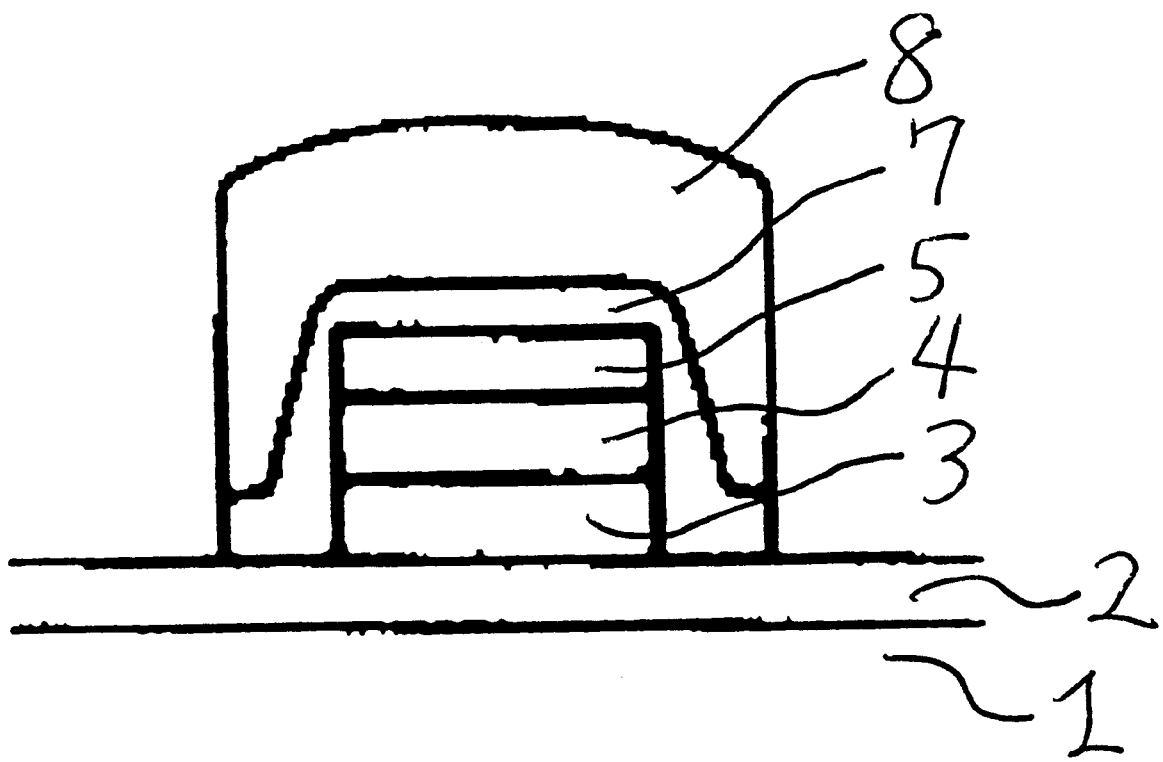

With reference to FIG. 5I, a third dry etching is carried out by use of the second photo-resist pattern 8 to selectively etch the second silicon nitride film 7.

Figure 5J:
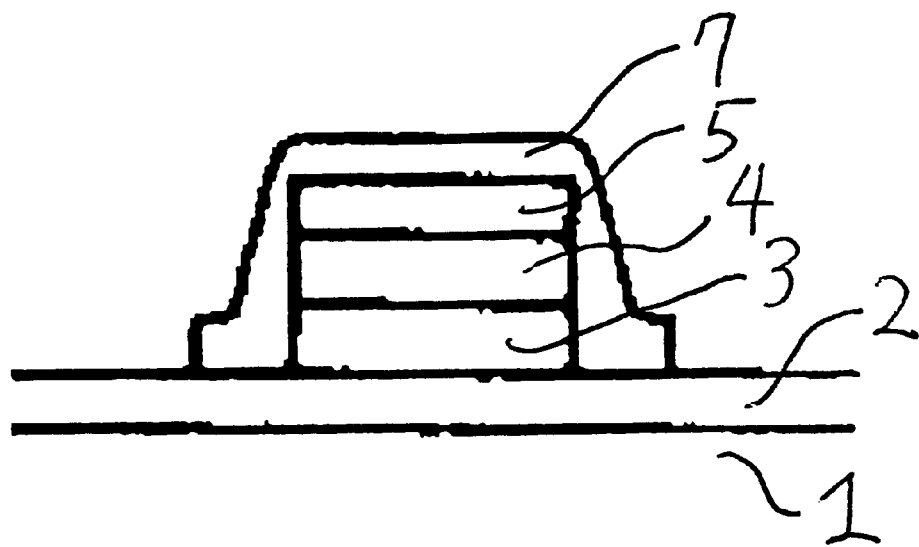

With reference to FIG. 5J, the second photo-resist pattern 8 is removed.

Figure 5K:
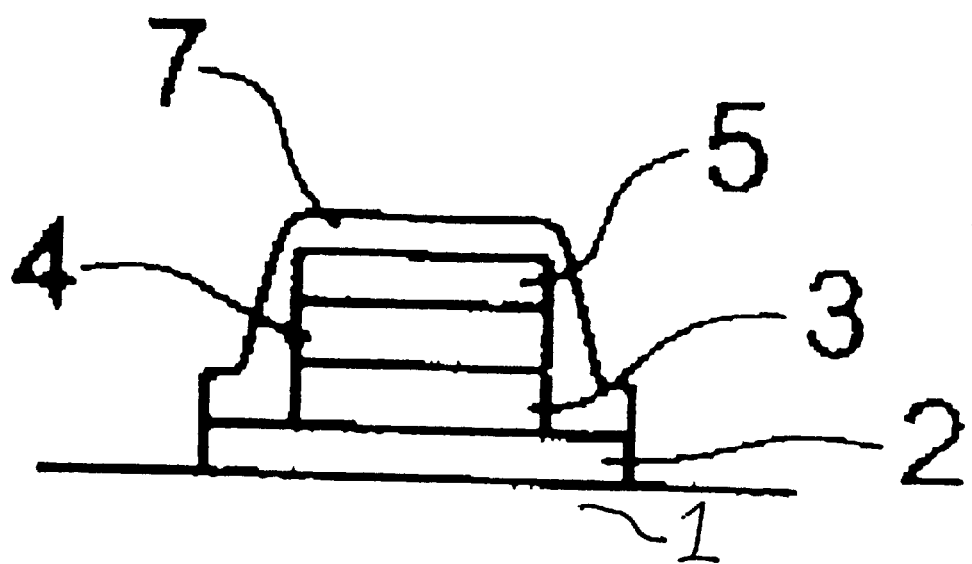

With reference to FIG. 5K, a fourth dry etching is carried out by use of the remaining second silicon nitride film 7 as a mask to selectively etch the bottom electrode layer 2.

Figure 5L:
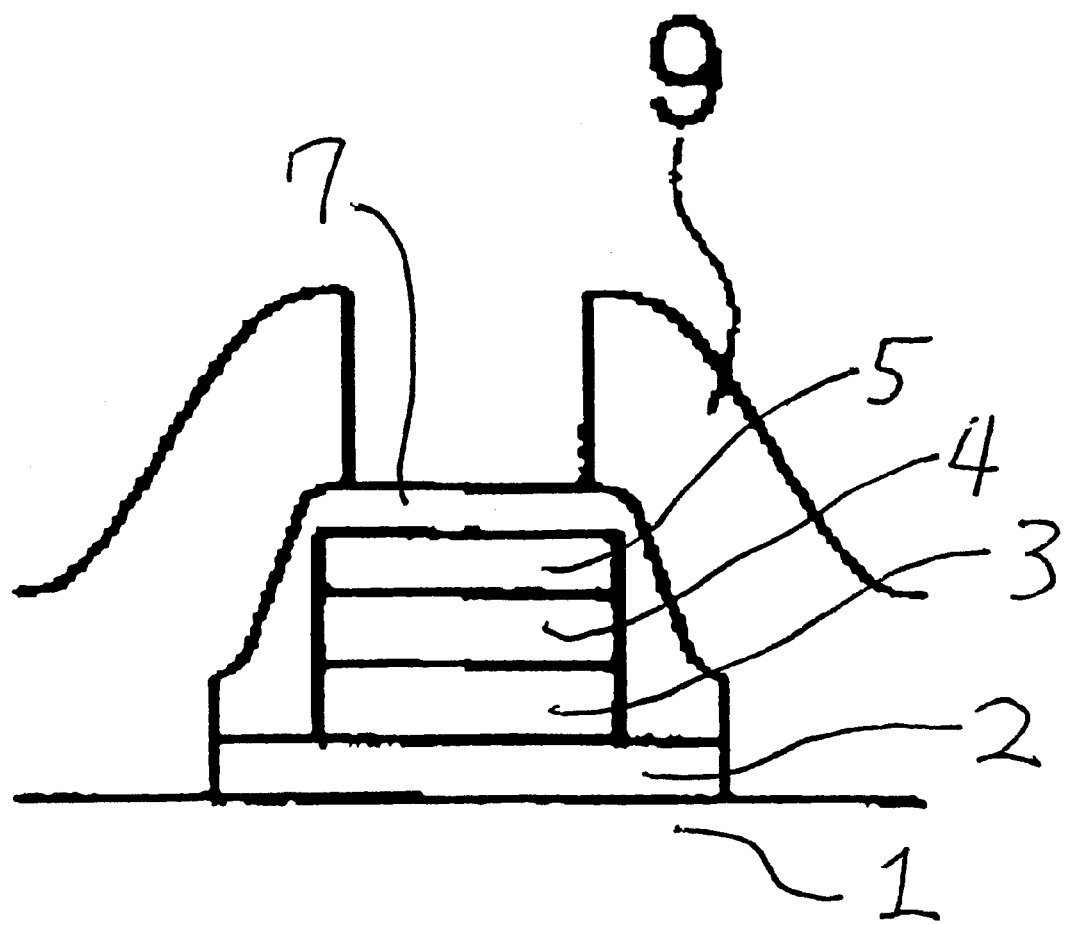

With reference to FIG. 5L, a third photo-resist pattern 9 having an opening positioned on the remaining second silicon nitride film 7 and over the first silicon nitride layer 5 is formed on the remaining second silicon nitride film 7.

Figure 5M:
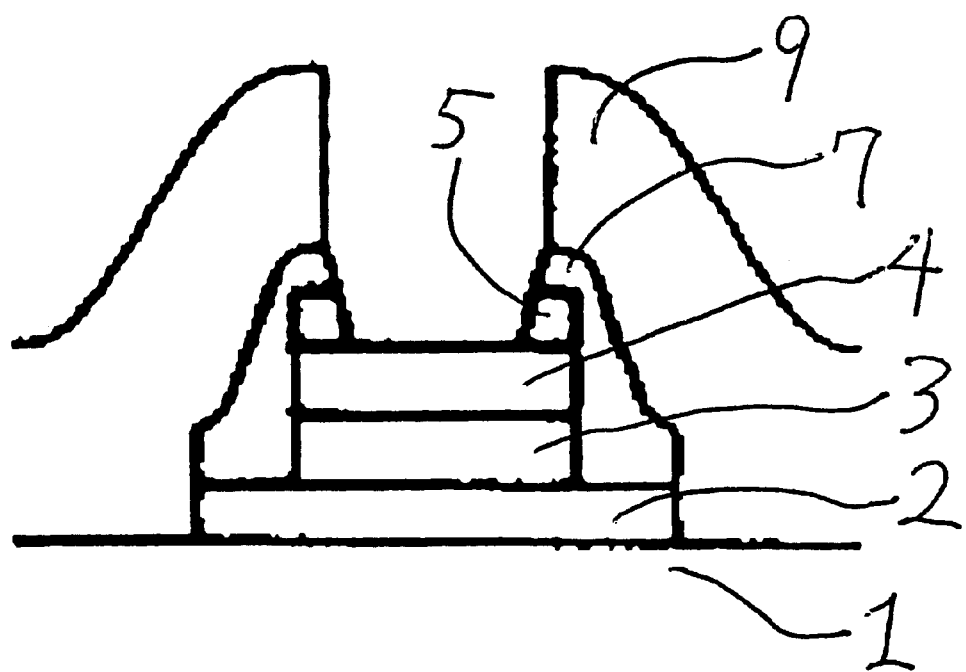

With reference to FIG. 5M, a fifth dry etching is carried out by use of the third photo-resist pattern 9 whereby openings are formed which penetrate the second silicon nitride film 7 and the first silicon nitride film 5, so that the opening is positioned over the top electrode 4 of the ferroelectric capacitor.

Figure 5N:
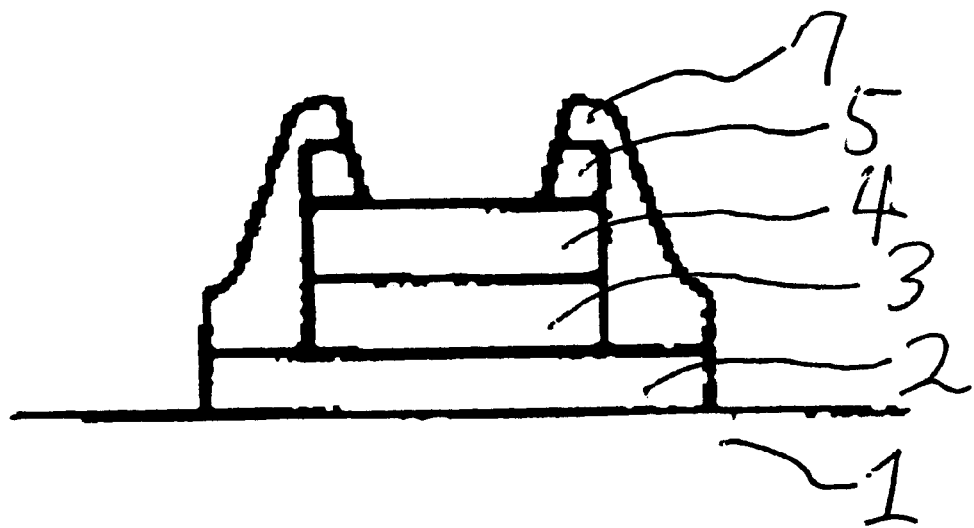

With reference to FIG. 5N, the third photo-resist pattern 9 is removed.

Figure 5O:
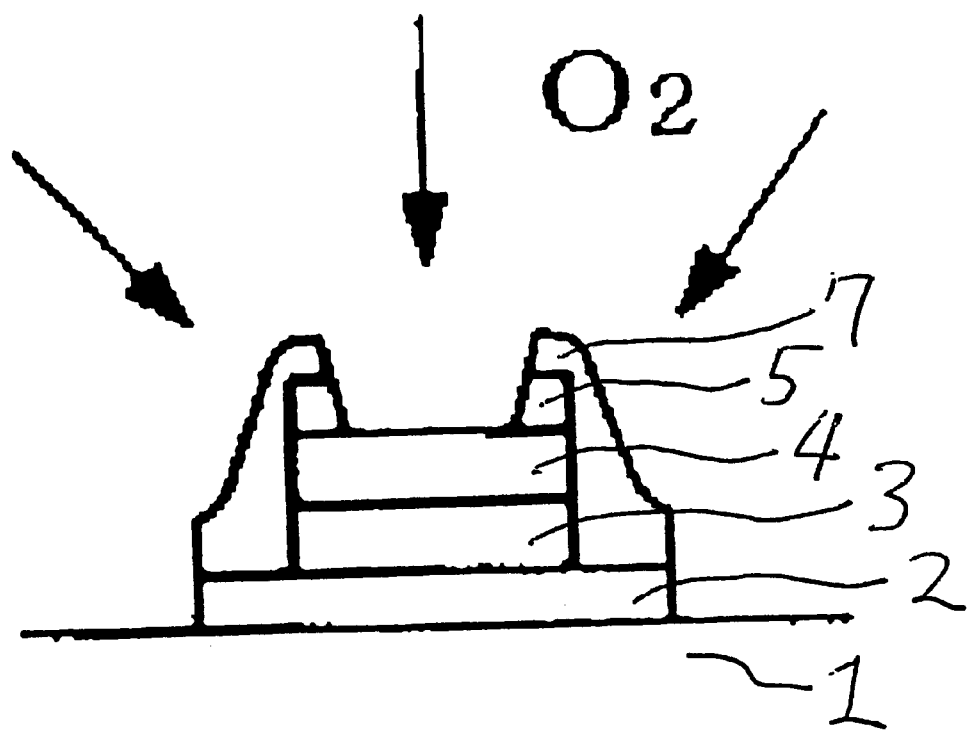

With reference to FIG. 5O, a heat treatment is carried out in an oxygen atmosphere to recover the damage of the PZT ferroelectric layer 3, wherein the PZT ferroelectric layer 3 has received the damage due to hydrogen generated in the above process of forming the silicon nitride layers 5 and 7.

Figure 5P:
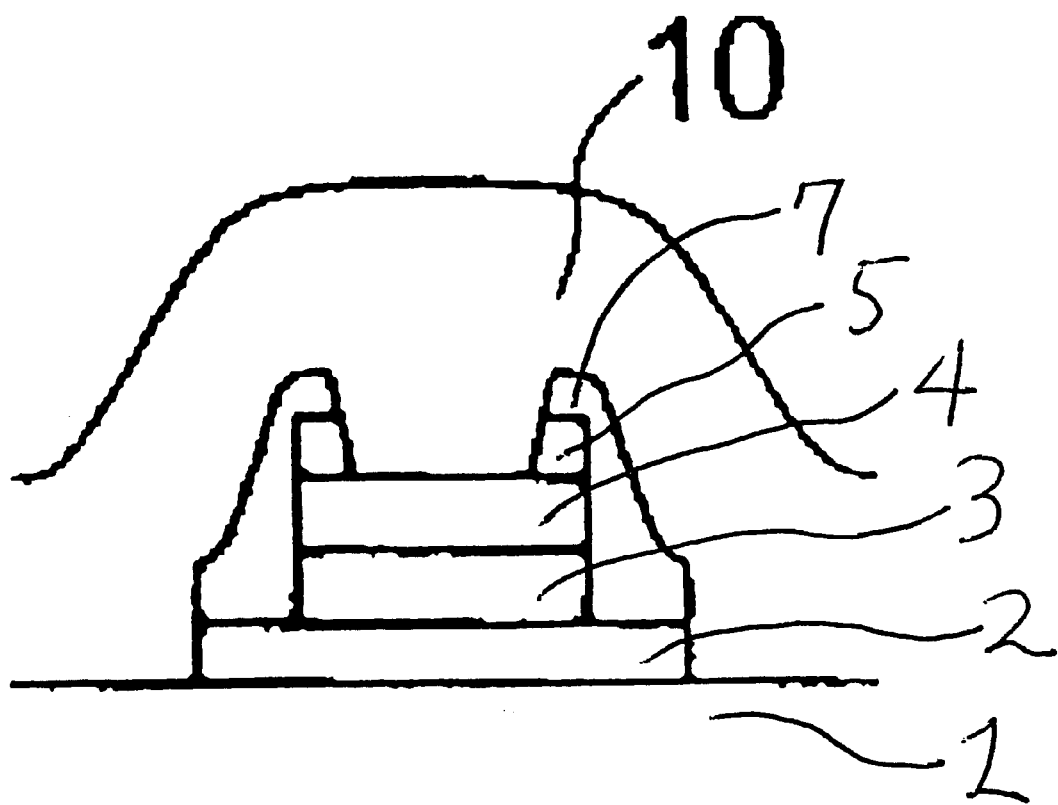

With reference to FIG. 5P, a capacitor cover layer 10 is entirely formed which covers the top of the top electrode 4 and the silicon oxide layers 5 and 7 of the ferroelectric capacitor.

Figure 6:
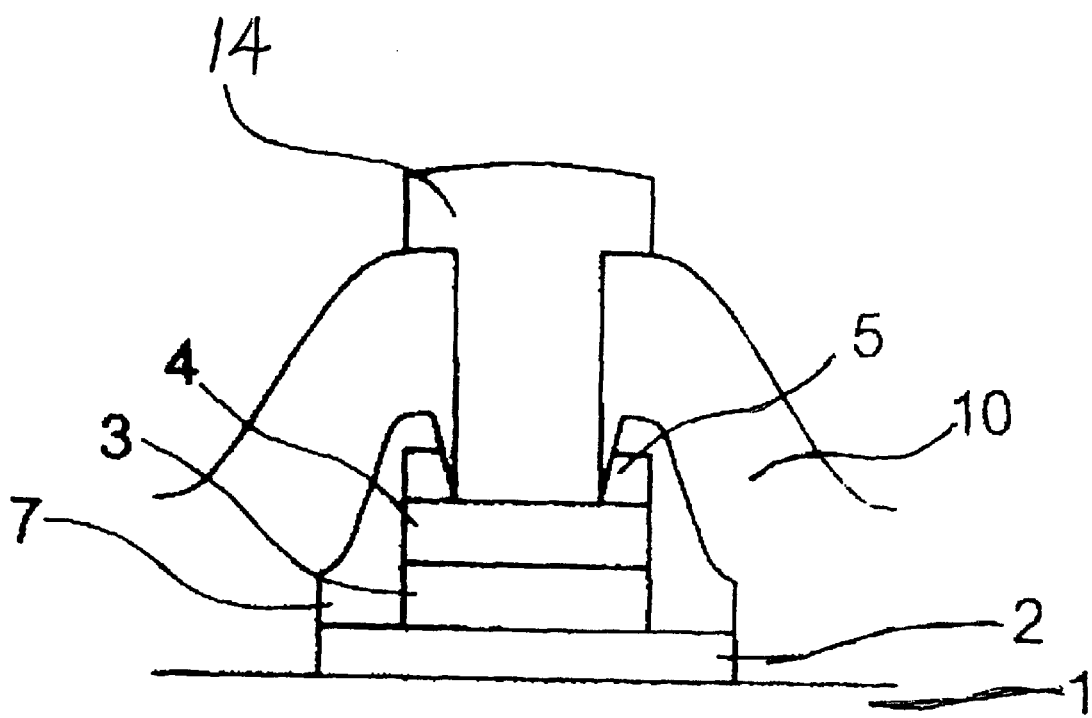
FIG. 6 is a fragmentary cross sectional elevation view illustrative of a final structure of a capacitor in a semiconductor device.

FIG. 6 is a fragmentary cross sectional elevation view illustrative of a final structure of a capacitor in a semiconductor device. Following to the above processes, an aluminum interconnection 14 is formed which is contact with the top of the top electrode of the capacitor.

PREFERRED EMBODIMENT

A first embodiment according to the present invention will be described in detail with reference to the drawings.

With reference to FIG. 5A, a bottom electrode layer 2 comprising laminations of a Pt layer having a thickness of 200 nanometers and a Ti layer having a thickness of about 20 nanometers is laminated on a BPSG base oxide layer 1. A PZT ferroelectric layer 3 having a thickness of 300 nanometers is laminated on the bottom electrode layer 2. A Pt top electrode layer 4 having a thickness of 200 nanometers is laminated on the PZT ferroelectric layer 3.

With reference to FIG. 5B, a first silicon nitride layer 5 is entirely deposited on the Pt top electrode layer 4 by a plasma enhanced chemical vapor deposition using $SiH_4$ and $NH_4$ at a substrate temperature of 300° C. The first silicon nitride layer 5 has a high film density. Hydrogen is generated by decomposition of $NH_4$ whereby hydrogen causes a reduction reaction of the PZT ferroelectric layer 3. The ferroelectric property of the PZT ferroelectric layer 3 is deteriorated.

With reference to FIG. 5C, a first photo-resist pattern 6 is selectively formed on the first silicon nitride layer 5. The first photo-resist pattern 6 corresponds to a top electrode pattern.

With reference to FIG. 5D, a first dry etching is carried out by use of the first photo-resist pattern 6 to selectively etch the first silicon nitride layer 5. The dry etching is a reactive ion etching, wherein a $CF_4$ or $CHF_3$ gas is used.

With reference to FIG. 5E, the first photo-resist pattern 6 is removed by a aching method using an oxygen plasma.

With reference to FIG. 5F, a second dry etching is carried out by use of the remaining first silicon nitride layer 5 as a mask to selectively etch laminations of the PZT ferroelectric layer 3 and the Pt top electrode layer 4. The dry etching is a reactive ion etching by use of a mixture gas of $Cl_2$ and Ar. It is also possible to use a mixture gas of $CF_4$ and Ar to etch the PZT ferroelectric layer 3. Other etching parameters such as pressure may be different in etching the Pt top electrode layer 4 and in etching the PZT ferroelectric layer 3. By this reaction ion etching, the silicon nitride layer 5 as the mask is also etched. However, the etching rates of the Pt top electrode layer 4 and the PZT ferroelectric layer are higher than the etching rate of the silicon nitride layer 5. After the reaction ion etching to the Pt top electrode layer 4 has been completed, then the thickness of the silicon nitride layer 5 is about 50 nanometers. At this time, a side wall deposit is formed on a side wall of the silicon nitride layer 5. The height of the side wall deposit is about 50 nanometers which is the same as the height of the silicon nitride layer 5. Since the silicon nitride layer 5 was used as a mask for the dry etching process, the cross sectional shape of the etched part is not tapered, whereby a highly accurate horizontal size of the top electrode can be obtained.

With reference to FIG. 5G, a second silicon nitride film 7 is entirely formed which covers the remaining first silicon nitride layer 5 and the bottom electrode layer 2 by a plasma enhanced chemical vapor deposition using $SiH_4$ and $NH_4$ at a substrate temperature of 300° C. The second silicon nitride layer 7 has a high film density. Hydrogen is generated by decomposition of $NH_4$ whereby hydrogen causes a reduction reaction of the PZT ferroelectric layer 3. The ferroelectric property of the PZT ferroelectric layer 3 is deteriorated.

With reference to FIG. 5H, a second photo-resist pattern 8 is formed which covers the second silicon nitride film 7 covering the laminated structure. The second photo-resist pattern 8 corresponds to a pattern of the bottom electrode.

With reference to FIG. 5I, a third dry etching is carried out by use of the second photo-resist pattern 8 to selectively etch the second silicon nitride film 7.

With reference to FIG. 5J, the second photo-resist pattern 8 is removed.

With reference to FIG. 5K, a fourth dry etching is carried out by use of the remaining second silicon nitride film 7 as a mask to selectively etch the bottom electrode layer 2. The dry etching is a reactive ion etching by use of a mixture gas of $Cl_2$ and Ar. By this reaction ion etching, the silicon nitride layer 7 as the mask is also etched. However, the etching rates of the bottom electrode layer 2 is higher than the etching rate of the silicon nitride layer 7. After the reaction ion etching to the bottom electrode layer 2 has been completed, then the thickness of the silicon nitride layer 7 is about 50 nanometers. At this time, a side wall deposit is formed on a side wall of the silicon nitride layer 7. The height of the side wall deposit is about 50 nanometers which is the same as the height of the silicon nitride layer 7. Since the silicon nitride layer 7 was used as a mask for the dry etching process, the cross sectional shape of the etched part is not tapered, whereby a highly accurate horizontal size of the top electrode can be obtained.

With reference to FIG. 5L, a third photo-resist pattern 9 having an opening positioned on the remaining second silicon nitride film 7 and over the first silicon nitride layer 5 is formed on the remaining second silicon nitride film 7.

With reference to FIG. 5M, a fifth dry etching is carried out by use of the third photo-resist pattern 9 whereby openings are formed which penetrate the second silicon nitride film 7 and the first silicon nitride film 5, so that the opening is positioned over the top electrode 4 of the ferroelectric capacitor.

With reference to FIG. 5N, the third photo-resist pattern 9 is removed.

With reference to FIG. 5O, a heat treatment is carried out at a temperature of about 600° C. in an oxygen atmosphere to recover the damage of the PZT ferroelectric layer 3, wherein the PZT ferroelectric layer 3 has received the damage due to hydrogen generated in the above process of forming the silicon nitride layers 5 and 7. Namely, the oxygen loss caused by the hydrogen generated in the above process of forming the silicon nitride layers 5 and 7 can be compensated.

With reference to FIG. 5P, a capacitor cover layer 10 having a thickness of 300 nanometers is entirely formed which covers the top of the top electrode 4 and the silicon oxide layers 5 and 7 of the ferroelectric capacitor. The capacitor cover layer 10 may be deposited by a chemical vapor deposition under an atmospheric pressure y use of $O_3$ and TEOS. The atmosphere is not reduction atmosphere, for which reason the capacitor receives no damage or deterioration. The above capacitor cover film 10 is made of NSG. The capacitor cover film 10 may, however, be made of silicon oxide which is deposited by a plasma enhanced chemical vapor deposition method by use of $SiH_4$ and $N_2O$.

FIG. 6 is a fragmentary cross sectional elevation view illustrative of a final structure of a capacitor in a semiconductor device. Following to the above processes, an aluminum interconnection 14 is formed which is contact with the top of the top electrode of the capacitor. The first and second silicon nitride layers 5 and 7 remain in the capacitor.

In accordance with the above novel method, the first and second silicon nitride films remain to protect the ferroelectric layer from a heat treatment in a hydrogen atmosphere for forming the aluminum interconnection. Namely, the first and second silicon nitride films prevents a reduction reaction of the ferroelectric layer with hydrogen in the heat treatment. The required ferroelectric property of the ferroelectric capacitor can be obtained. Further as described above, the highly accurate capacitor size can also be obtained.

In the above embodiment, the silicon nitride masks are used for dry etching to the top and bottom electrodes. Other materials which have a barrier property to hydrogen may be available as the masks for the dry etching to the top and bottom electrodes. Particularly, in place of the silicon nitride mask layer 5, a titanium nitride layer or an aluminum nitride layer is also available, which is electrically conductive and has a barrier property to hydrogen. The titanium nitride layer or the aluminum nitride layer may be deposited by a sputtering method. The sputtering method does not use the reduction atmosphere which deteriorates the ferroelectric property of the capacitor. When the silicon nitride film 7 is formed in the reduction atmosphere by the plasma enhanced chemical vapor deposition method, the titanium nitride layer or the aluminum nitride layer protects the ferroelectric layer from the reduction atmosphere. The process of forming the opening as shown in FIG. 5N and the process of heat treatment in the oxygen atmosphere as shown in FIG. 5O are not necessarily required.

In the above embodiment, the ferroelectric material is PZT. Other ferroelectric materials such as $SrBi_2Ta_2O_9$, $(Ba_{1-x},Sr_x)TiO_3$ may be available. In order to improve the ferroelectric property, it is also possible to dope La, Nb or Ca into the above ferroelectric material.

In the above embodiment, Pt is used for the top and bottom electrodes. Other conductive materials such as Ir, $IrO_2$, Ru, $RuO_2$, W, $WSi_x$, TiN, WN are available. The top and bottom electrodes may be made of different materials from each other.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A capacitor in a semiconductor device comprising:

top and bottom electrodes; and a capacitive dielectric layer sandwiched between said top and bottom electrodes, wherein at least a top surface of said top electrode is covered by at least a protective film which has a lower etching rate than said top and bottom electrodes and also has a barrier property to hydrogen, and wherein said protective film comprises:

a first protective film which is provided on at least a part of a top surface of said top electrode; and a second protective film which covers said capacitor and said first film.

2. The capacitor as claimed in claim 1, wherein each of said first and second protective films is made of one selected from the group consisting of silicon nitride, titanium nitride, aluminum nitride and tungsten nitride.

3. The capacitor as claimed in claim 1, wherein a contact hole is provided which penetrates said first and second protective films.

4. The capacitor as claimed in claim 1, wherein said capacitive dielectric layer is made of a ferroelectric material.

* * * * *

UNITED STATES PATENT AND TRADEMARK OFFICE
CERTIFICATE OF CORRECTION

PATENT NO. : 6,295,195 B1
DATED : July 10, 2001
INVENTOR(S) : Edwin A. Montie, Jeroen Van Engelshoven and Ronald van der Wilk It is certified that error appears in the above-identified patent and that said Letters Patent is hereby corrected as shown below:

<u>Column 6,</u>
Line 37, after "strength" insert -- along the --.

Signed and Sealed this

Nineteenth Day of November, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,295,195 B1
DATED : September 25, 2001
INVENTOR(S) : Yukihiko Maejima It is certified that error appears in the above-identified patent and that said Letters Patent is hereby corrected as shown below:

This certificate supersedes Certificates of Correction issued November 19, 2002 the number was erroneously mentioned and should be vacated since no Certificate of Correction was granted.

Signed and Sealed this

Twenty-first Day of January, 2003

JAMES E. ROGAN
*Director of the United States Patent and Trademark Office*